(12) United States Patent
Dubin et al.

(10) Patent No.: US 8,911,609 B2
(45) Date of Patent: Dec. 16, 2014

(54) METHODS FOR ELECTROPLATING COPPER

(75) Inventors: Valery M. Dubin, Portland, OR (US); Xingling Xu, Moses Lake, WA (US); Yingxiang Tao, Moses Lake, WA (US); James D. Blanchard, Soap Lake, WA (US)

(73) Assignee: Moses Lake Industries, Inc., Moses Lake, WA (US)

( * ) Notice: Subject to any disclaimer, the term of this patent is extended or adjusted under 35 U.S.C. 154(b) by 0 days.

(21) Appl. No.: 13/452,139

(22) Filed: Apr. 20, 2012

(65) Prior Publication Data

US 2012/0199491 A1    Aug. 9, 2012

Related U.S. Application Data

(63) Continuation of application No. 12/080,680, filed on Apr. 4, 2008, now abandoned.

(51) Int. Cl.

| | |
|---|---|
| *C25D 3/38* | (2006.01) |
| *H01L 21/288* | (2006.01) |
| *H01L 31/0224* | (2006.01) |
| *C25D 17/10* | (2006.01) |
| *C25D 17/12* | (2006.01) |
| *C25D 5/00* | (2006.01) |
| *C25D 17/00* | (2006.01) |
| *H01L 21/67* | (2006.01) |
| *H05K 3/24* | (2006.01) |
| *C25D 5/18* | (2006.01) |

(52) U.S. Cl.
CPC . *C25D 3/38* (2013.01); *Y02E 10/50* (2013.01); *H01L 21/2885* (2013.01); *H01L 31/022425* (2013.01); *C25D 17/10* (2013.01); *H05K 3/241* (2013.01); *C25D 17/12* (2013.01); *C25D 5/00* (2013.01); *C25D 17/001* (2013.01); *H01L 21/67011* (2013.01); *C25D 5/18* (2013.01)
USPC ............................ 205/291; 205/96; 205/157

(58) Field of Classification Search
USPC .................................................. 205/96, 291
See application file for complete search history.

(56) References Cited

U.S. PATENT DOCUMENTS

| | | | | |
|---|---|---|---|---|
| 4,462,874 | A | * | 7/1984 | Tomaszewski et al. ........ 205/292 |
| 4,933,051 | A | * | 6/1990 | Kline ............................. 205/295 |
| 5,476,578 | A | * | 12/1995 | Forand et al. ................. 204/207 |
| 5,935,402 | A | * | 8/1999 | Fanti ............................. 205/101 |
| 6,242,349 | B1 | * | 6/2001 | Nogami et al. ............... 438/687 |
| 6,989,084 | B2 | * | 1/2006 | Tench et al. ................ 204/275.1 |
| 7,232,513 | B1 | * | 6/2007 | Webb et al. .................... 205/298 |

(Continued)

*Primary Examiner* — Bryan D. Ripa
(74) *Attorney, Agent, or Firm* — Thomas J. Engellenner; Reza Mollaaghababa; Pepper Hamilton LLP (57) ABSTRACT

Embodiments of the invention are directed to methods of electroplating copper onto at least one surface of a substrate in which more uniform electrical double layers are formed adjacent to the at least one surface being electroplated (i.e., the cathode) and an anode of an electrochemical cell, respectively. In one embodiment, the electroplated copper may be substantially-free of dendrites, exhibit a high-degree of (111) crystallographic texture, and/or be electroplated at a high-deposition rate (e.g., about 6 μm per minute or more) by electroplating the copper under conditions in which a ratio of a cathode current density at the at least one surface to an anode current density at an anode is at least about 20. In another embodiment, a porous anodic film may be formed on a consumable copper anode using a long conditioning process that promotes forming a more uniform electrical double layer adjacent to the anode.

17 Claims, 4 Drawing Sheets

(56) References Cited

U.S. PATENT DOCUMENTS

| | | | |
|---|---|---|---|
| 2002/0008036 A1* | 1/2002 | Wang | 205/118 |
| 2003/0150715 A1* | 8/2003 | Yahalom et al. | 204/229.1 |
| 2004/0016636 A1* | 1/2004 | Yang et al. | 204/237 |
| 2004/0200727 A1* | 10/2004 | Aiba et al. | 205/157 |
| 2006/0012044 A1* | 1/2006 | Knop et al. | 257/750 |
| 2006/0065537 A1* | 3/2006 | Barstad et al. | 205/291 |
| 2006/0081477 A1* | 4/2006 | Basol | 205/123 |
| 2007/0012576 A1* | 1/2007 | Binstead et al. | 205/291 |
| 2007/0089995 A1* | 4/2007 | Loo et al. | 205/296 |
| 2007/0125657 A1* | 6/2007 | Sun et al. | 205/205 |

* cited by examiner

METHODS FOR ELECTROPLATING COPPER

CROSS-REFERENCE TO RELATED APPLICATIONS

This application is a continuation of U.S. patent application Ser. No. 12/080,680, entitled "METHODS FOR ELECTROPLATING COPPER," filed on Apr. 4,2008, the entire contents of which are incorporated herein by reference.

BACKGROUND

Copper-based materials have currently supplanted aluminum-based materials as the material of choice for interconnects in integrated circuits ("ICs"). Copper offers a lower electrical resistivity and a higher electromigration resistance than that of aluminum, which has historically been the dominant material used for interconnects.

Interconnects in ICs are becoming one of the dominant factors for determining system performance and power dissipation. For example, the total length of interconnects in many currently available ICs can be twenty miles or more. At such lengths, interconnect resistance-capacitance ("RC") time delay can exceed a clock cycle and severely impact device performance. Additionally, the interconnect RC time delay also increases as the size of interconnects continues to relentlessly decrease with corresponding decreases in transistor size. Using a lower resistivity material, such as copper, decreases the interconnect RC time delay, which increases the speed of ICs that employ interconnects formed from copper-based materials. Copper also has a thermal conductivity that is about two times aluminum's thermal conductivity and an electromigration resistance that is about ten to about one-hundred times greater than that of aluminum.

Copper-based interconnects have also found utility in other applications besides ICs. For example, solar cells, flat-panel displays, and many other types of electronic devices can benefit from using copper-based interconnects for the same or similar reasons as ICs.

Due to difficulties uniformly depositing and void-free filling trenches and other small features with copper using physical vapor deposition ("PVD") and chemical vapor deposition ("CVD"), copper interconnects are typically fabricated using a Damascene process. In the Damascene process, a trench is formed in, for example, an interlevel dielectric layer, such as a carbon-doped oxide. The dielectric layer is covered with a barrier layer formed from, for example, tantalum or titanium nitride to prevent copper from diffusing into the silicon substrate and degrading transistor performance. A seed layer is formed on the barrier layer to promote uniform deposition of copper within the trench. The substrate is immersed in an electroplating solution that includes copper. The substrate functions as a cathode of an electrochemical cell in which the electroplating solution functions as an electrolyte, and the copper from the electroplating solution or a consumable anode is electroplated into the trench responsive to a voltage applied between the substrate and an anode. Then, copper deposited on regions of the substrate outside of the trench is removed using chemical-mechanical polishing ("CMP").

Regardless of the particular electronic device in which copper is used as a conductive structure, it is important that an electroplating process for copper be sufficiently fast to enable processing a large number of substrates and have an acceptable yield. Additionally, the cost of the electroplating solution is also another factor impacting overall fabrication cost of electronic devices using copper. This is particularly important in the fabrication of solar cells, which have to cost-effectively compete with other, potentially more cost-effective, energy generation technologies. Thus, it is desirable that copper electroplating solutions be capable of depositing copper in a uniform manner (i.e., high-throwing power) and at a high-deposition rate.

A number of electroplating solutions are currently available for electroplating copper. For example, sulfate-based electroplating solutions are commonly used for electroplating copper. Some alkaline copper electroplating solutions have a high-throwing power, but are not capable of rapidly depositing copper without compromising the deposited film quality. At high-deposition rates, the copper may grow as dendrites as opposed to a more uniformly deposited film. Additionally, alkali elements (e.g., sodium and potassium) in such alkaline copper electroplating solutions can diffuse into silicon substrates and are deep-level impurities in silicon that can compromise transistor performance. Fluoroborate electroplating solutions can be used for high-speed deposition of copper. However, fluoroborate electroplating solutions can be more expensive than, more traditional, sulfate-based solutions. Moreover, fluoroborate electroplating solutions may be more hazardous and difficult to dispose of than many other electroplating solutions for electroplating copper.

SUMMARY

Embodiments of the invention are directed to methods of electroplating copper onto at least one surface of a substrate in which more uniform electrical double layers are formed adjacent to the at least one surface being electroplated (i.e., the cathode) and an anode of an electrochemical cell, respectively. The electroplated copper may be of high-quality and electroplated at a high-deposition rate so that the electroplated copper may be used, for example, in electrical interconnects for ICs, solar cells, and many other applications.

In one embodiment of the invention, a method is disclosed in which the electroplated copper may be substantially-free of dendrites, exhibit a high-degree of (111) crystallographic texture, and/or be electroplated at a high-deposition rate (e.g., about 6 μm per minute or more) by electroplating copper under conditions in which a ratio of a cathode current density at the at least one surface of the substrate being electroplated to an anode current density at an anode is at least about 20. In such an embodiment, the method includes forming an electrochemical cell comprising at least one surface of a substrate, an anode, and an electroplating solution in contact with the at least one surface and the anode, wherein the electroplating solution includes at least one suppressor agent. The method further includes electroplating copper onto the at least one surface under conditions in which a ratio of a cathode current density at the surface to an anode current density at the anode is at least about 20.

In another embodiment of the invention, a method includes forming an electrochemical cell comprising a cathode, a consumable copper-containing anode, and an electroplating solution in contact with the cathode and the consumable copper-containing anode. The method further includes forming a porous anodic film on the consumable copper-containing anode by generating a current through the electrochemical cell for a time sufficient to pass at least about 1000 coulombs per liter through the electroplating solution. In one embodiment, the cathode may be a conditioning cathode that is replaced with a substrate having at least one surface to be electroplated that functions as a cathode. In such an embodiment, the method also includes electroplating copper onto the at least one surface of the substrate. In another embodiment, the consumable copper-containing anode may be conditioned to form the porous anodic film in a separate electrochemical cell, and subsequently removed and employed in a plating electrochemical cell in which at least one surface of a substrate to be electroplated functions as the cathode.

Other embodiments of the invention relate to methods of synthesizing an accelerator agent that is substantially free of alkali elements for use in an electroplating solution.

BRIEF DESCRIPTION OF THE DRAWINGS

The drawings illustrate various embodiments of the invention, wherein identical reference numerals refer to identical elements or features in different views or embodiments shown in the drawings.

DETAILED DESCRIPTION

Embodiments of the invention are directed to methods of electroplating copper onto at least one surface of a substrate in which more uniform electrical double layers are formed adjacent to the at least one surface being electroplated (i.e., the cathode) and an anode of an electrochemical cell, respectively. The electroplated copper may be used in electrical interconnects for ICs, solar cells, and many other applications. For example, in an embodiment, the electroplated copper may be substantially-free of dendrites, exhibit a high-degree of (111) crystallographic texture, and/or be electroplated at a high-deposition rate (e.g., about 6 µm per minute or more) by electroplating the copper under conditions in which a ratio of a cathode current density at the at least one surface to an anode current density at an anode is at least about 20. In another embodiment, a porous anodic film may be formed on a consumable copper anode using a long-conditioning process that promotes forming a more uniform electrical double layer adjacent to the anode during electroplating.

Electroplating Apparatuses for Practicing Described Electroplating Methods

Figure 1:
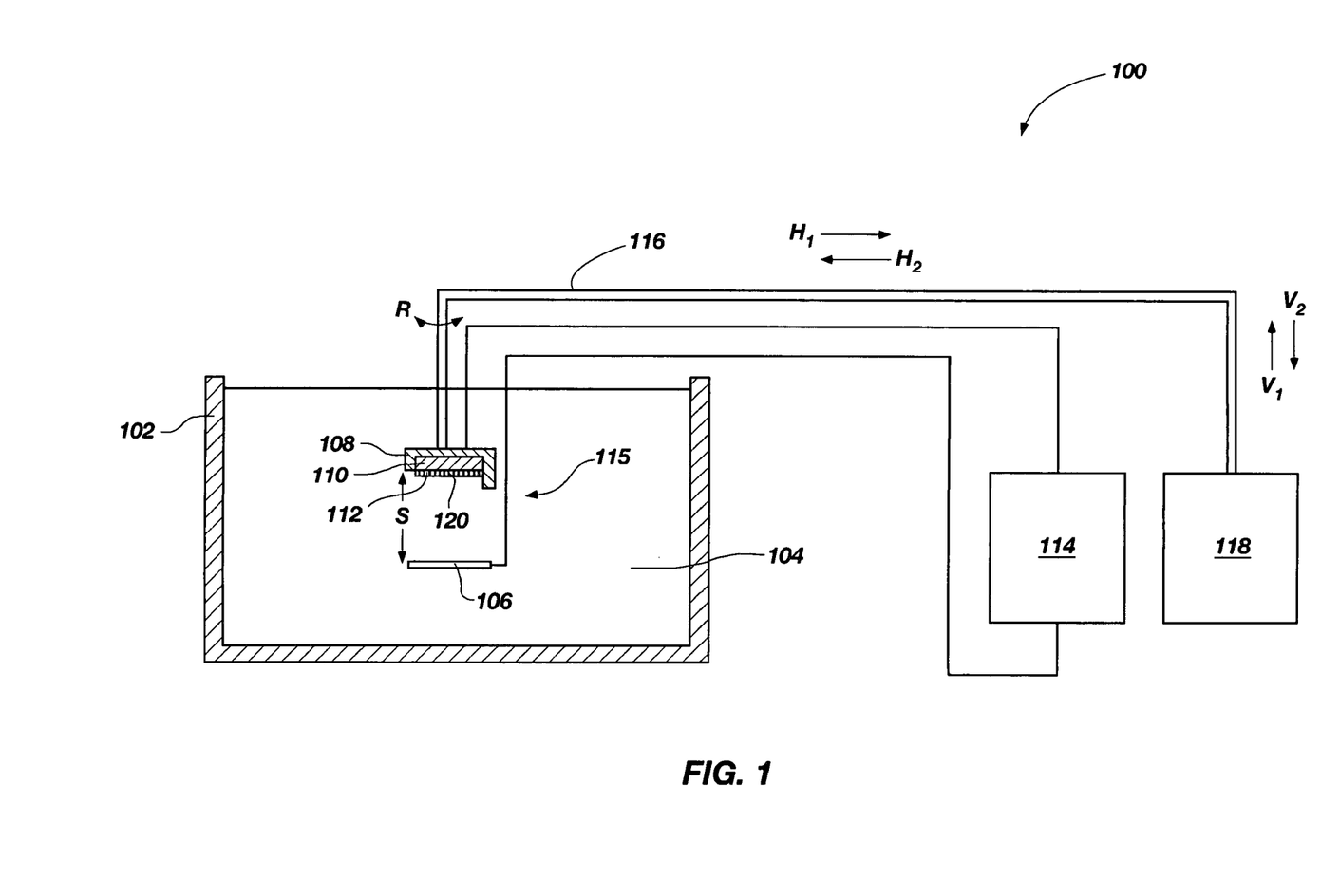
FIG. 1 is a schematic cross-sectional view of an embodiment of an electroplating apparatus that may be used for electroplating copper onto at least one surface of a substrate according to embodiments of methods of the invention.

FIG. 1 is a schematic cross-sectional view of an embodiment of an electroplating apparatus 100 that may be employed for practicing embodiments of methods of the invention. The electroplating apparatus 100 includes a container 102 holding an electroplating solution 104 comprising at least one suppressor agent and having a high-surface area anode 106 immersed therein. Although not shown in FIG. 1, the electroplating apparatus 100 may include a heating unit configured to maintain the electroplating solution 104 at a temperature of about 20° C. to about 60° C. and, more specifically, at about 40° C. A substrate holder 108 is configured to hold a substrate 110, having at least one surface 112, to be electroplated in the electroplating solution 104. The substrate holder 108 may be configured according to any conventional or subsequently developed substrate holder. Although only a single substrate is illustrated in FIG. 1 for simplicity, many commercially available substrate holders are configured to hold multiple substrates. Additionally, as used herein, the term "substrate" refers to any workpiece capable of being electroplated. For example, suitable substrates include, but are not limited to, semiconductor substrates (e.g., single-crystal silicon wafers, single-crystal gallium arsenide wafer, etc.) with or without active and/or passive devices (e.g., transistors, diodes, capacitors, resistors, etc.) formed therein and with or without at least one surface coated with a seed layer, printed circuit boards, flexible polymeric substrates, and many other types of substrates. As will be discussed in more detail below, the electroplating solution 104 is formulated and the anode 106 is configured so that a generally uniform electrical double layer is formed at both the surface 112 being electroplated and the anode 106 so that a more uniform current density is developed at both the surface 112 (i.e., cathode) and the anode 106.

A power supply 114 is electrically connected to the anode 106 and, through electrical contacts (not shown) in the substrate holder 108, to the surface 112 of the substrate 110 to be electroplated. The power supply 114 may be operable to apply a selected voltage waveform between the anode 106 and substrate 110, such as a constant voltage, a time-varying voltage waveform, or both. Thus, the surface 112 of the substrate 110 defining a cathode, the anode 106, and the electroplating solution 104 form an electrochemical cell 115.

Still referring to FIG. 1, a movable arm 116 is connected to the substrate holder 108 and may orient the surface 112 of the substrate 110 downwardly, and further is operably connected to an actuator system 118. The surface 112 may be spaced from the anode 106 by a spacing S of about 0.5 to about 50 centimeters ("cm"). The actuator system 118 is operable to selectively move the movable arm 116 in directions $V_1$ and $V_2$ to enable immersing and removal of the substrate holder 108 carrying the substrate 110 from the electroplating solution 108. Additionally, the actuator system 118 may be operable to controllably move the movable arm 116 in directions $H_1$ and $H_2$ in a linearly oscillatory manner to move the substrate 110 in the directions $H_1$ and $H_2$, rotate the movable arm 116 and the substrate holder 108 connected thereto in a direction R, or both during electroplating.

The electroplating apparatus 100 may also include a number of containers (not shown) holding different solutions, such as a cleaning solution, drying solution, rinsing solution, etc. Furthermore, a variety of different fluid supply systems may be employed to supply the various fluids in the containers and, optionally, to re-circulate the electroplating solution 104 to provide a generally laminar flow of the electroplating solution 104 over the substrate 110. Such fluid supply systems, container configurations, and cleaning/drying/rinsing solutions are well-known and in the interest of brevity are not described in detail herein.

Embodiments of Methods for Electroplating Copper

Referring to FIG. 1, according to an embodiment of a method of the invention, the electrochemical cell 115 is formed by immersing the substrate holder 108 carrying the substrate 110 in the electroplating solution 104 so that the surface 112 and anode 106 are in contact with the electroplating solution 104. As will be discussed in more detail below, the electroplating solution 104 is formulated with at least one suppressor agent to promote forming a more uniform electrical double layer adjacent to the surface 112 during electroplating. That is, the resistance drop across the electrical double layer in the electroplating solution 104 adjacent to the surface 112 is more uniform in a direction generally parallel to the surface 112. Additionally, the high-surface area anode 106 is configured to provide a more uniform electrical double layer adjacent to the anode 106 during electroplating. That is, the resistance drop across the electrical double layer in the electroplating solution 104 adjacent to the anode 106 is more uniform in a direction along the length of and about the anode 106.

A copper film 120 is electroplated onto the surface 112 of the substrate 110 under conditions in which a ratio of a cathode current density at the surface 112 to an anode current density at the anode 106 is at least about 20 (e.g., about 20 to about 200) by application of a selected voltage waveform between the surface 112 and the anode 106 using the power supply 114. Furthermore, the ratio may be about 20 to about 100, more particularly about 40 to about 100, even more particularly about 60 to about 100, and yet even more particularly about 80 to about 100. The surface area of the anode 106 relative to the surface area of the surface 112 being electroplated, and the suppression strength of the at least one suppressor agent are selected to that the above ratios may be maintained during electroplating of the copper film 120. The electroplating copper that forms the copper film 120 may be provided from the anode 106 when the anode 106 is a consumable anode or may be provided from copper intentionally added to the electroplating solution 104.

During electroplating of the copper film 120, the substrate 110 may be linearly oscillated at a rate of about 10 millimeters per second ("mm/s") to about 1000 mm/s back and forth in the directions $H_1$ and $H_2$. In another embodiment, the substrate holder 108 and substrate 110 may be rotated in the direction R as a unit while the surface 112 of the substrate 110 is maintained generally parallel to a longitudinal axis of the anode 106. For example, the substrate holder 108 and substrate 110 may be rotated in the direction R as a unit at a rotational speed of about 150 revolutions per minute ("RPM") to about 300 RPM and, more particularly, about 200 RPM. In other embodiments of the invention, a combination of linear oscillatory movement of the substrate holder 108 and substrate 110 as a unit in the directions $H_1$ and $H_2$ and rotational movement in the direction R may be used. Utilizing any of the above-described techniques for linearly oscillating and/or rotating the substrate 110 enables increasing the limiting current density at the substrate 110 that is limited by diffusion of cupric ions within the electroplating solution 104 to the surface 112 of the substrate 110.

During the electroplating process, in one embodiment of the invention, the power supply 114 may apply a generally constant voltage between the surface 112 of the substrate 110 and the anode 106. In another embodiment of the invention, the power supply 114 may apply time-varying voltage to impose a forward-pulse current density on the substrate 110 to promote forming a finer grain size in the copper film 120. Representative cathode current densities at the surface 112 of the substrate 110 (i.e., the cathode) for a forward-pulse current density waveform may be about 200 mA/cm$^2$ to about 2000 mA/cm$^2$, while anode current densities at the anode 106 may be about 10 mA/cm$^2$ or less. In another embodiment, the power supply 114 may apply a time-varying voltage to impose a reverse-pulse current density waveform on the surface 112 of the substrate 110 or a combination of a forward-pulse and reverse-pulse current density waveform. Representative current densities at the surface 112 of the substrate 110 (i.e., the cathode) for the forward pulse of a forward-pulse/reverse-pulse current density waveform may be increased to about 10 A/cm$^2$ with a pulse duration of about 0.1 ms to about 100 ms. In the above-described time-varying voltage waveforms, the ratio of the cathodic current density to the anodic current density is determined by the peak current density at the cathode (i.e., the surface 112 of the substrate 110) to the corresponding peak current density at the anode 106.

The described embodiments of electroplating the copper film 120 that utilize the selectively formulated electroplating solution 104 in combination with the high-surface area anode 106 enables electroplating the copper film 120 at a high-deposition rate, such as about 6 μm per minute or more and, more particularly, about 9 μm per minute. Additionally, the electroplated copper film 120 may be substantially free of dendrites and exhibit a high-degree of (111) crystallographic texture that is more resistant to stress-induced voiding than other crystallographic textures.

Embodiments of Consumable Copper Anodes

Figure 2:
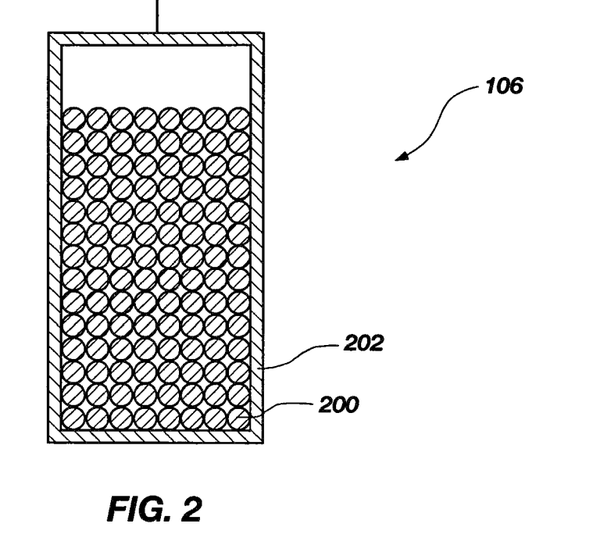
FIG. 2 is a cross-sectional view of a consumable, copper anode including a mass of copper particles enclosed in a porous membrane according to an embodiment of the invention.
Figure 3:
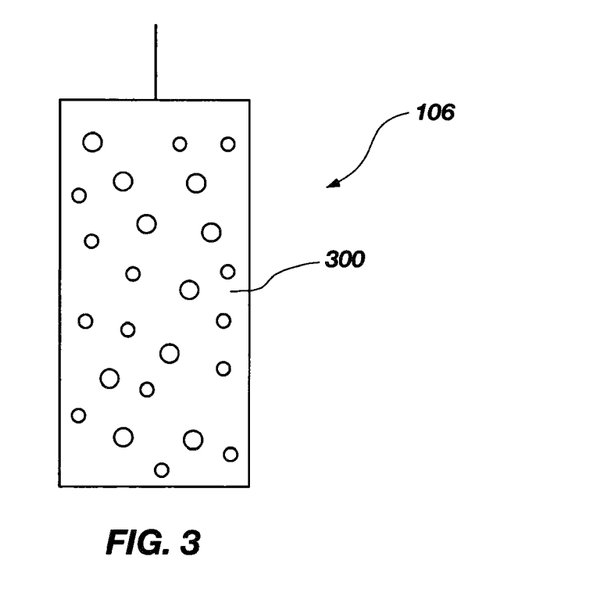
FIG. 3 is a side elevation view of a consumable, copper anode made from sintered copper particles according to an embodiment of the invention.
Figure 4:
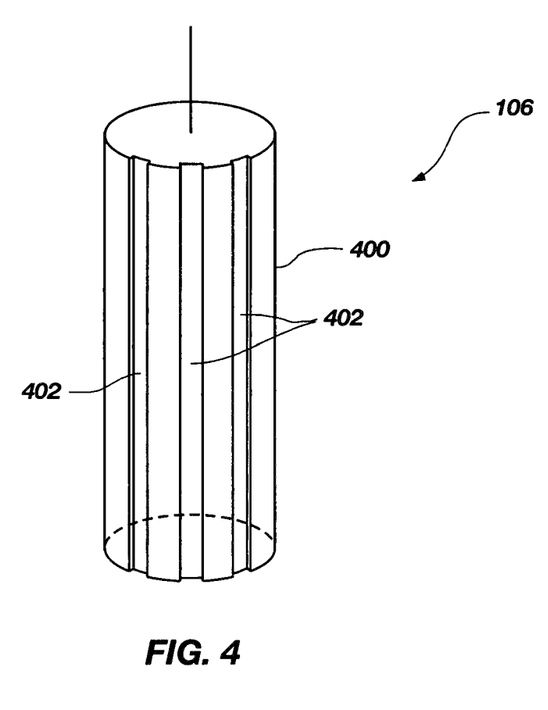
FIG. 4 is an isometric view of a consumable, copper anode comprising a body having a plurality of grooves formed therein according to an embodiment of the invention.

In an embodiment of the invention, the anode 106 may be a consumable, copper-containing anode. Referring to FIG. 2, in one embodiment, the anode 106 may be configured as a porous mass of copper particles 200 enclosed in a suitable polymeric membrane 202 that is permeable to cupric ions ($Cu^{2+}$) and the electroplating solution 104. Referring to FIG. 3, in another embodiment, the anode 106 may be configured as porous mass 300 of sintered-together copper particles. Referring to FIG. 4, in another embodiment, the anode 106 may be configured as a rod 400 or body of other geometry made from copper that includes a plurality of grooves 402 formed therein. In yet another embodiment, the anode 106 may be configured as a copper mesh. In any of the above-described embodiments for the anode 106, the anode 106 provides the copper to be deposited onto the surface 112 of the substrate 110. Application of the selected voltage waveform between the anode 106 and the surface 112 of the substrate 110 causes copper from the consumable anode 106 to oxidize, dissolve in the electroplating solution 104, and be electroplated onto the surface 112.

Embodiments of Electroplating Solutions

The electroplating solution 104 may formulated from at least one acid and at least one suppressor agent. In some embodiments of the invention, the electroplating solution 104 may also include at least one accelerator agent. The at least one acid may be selected from one or more of the following acids: sulfuric acid, methane sulfonic acid, hydrochloric acid, hydroiodic acid, hydroboric acid, fluoroboric acid, and any other suitable acid. In a more specific embodiment of the invention, the at least one acid includes sulfuric acid present in a concentration of about 100 grams per liter ("g/L") or less (e.g., about 5 g/L to about 100 g/L) and hydrochloric acid present in a concentration from about 20 mg/L to about 100 mg/L. In addition to the aforementioned acids, in certain embodiments of the invention, the electroplating solution 104 may further include a supplemental acid selected to increase the solubility of the copper from the consumable anode 106 in the at least one acid. For example, the supplemental acid may be selected from alkane sulfonic acid, methane sulfonic acid, ethane sulfonic acid, propane sulfonic acid, buthane sulfonic acid, penthane sulfonic acid, hexane sulfonic acid, decane sulfonic acid, dedecane sulfonic acid, fluoroboric acid, mixtures of any of the preceding supplemental acids, or another suitable acid selected to increase the solubility of the copper in the at least one acid of the electroplating solution 104.

As discussed above, the electroplating solution 104 may include additives, such as a suppressor agent, an accelerator agent, or both that improve certain electroplating characteristics of the electroplating solution 104. As used herein, the phrase "virgin make solution" ("VMS") refers to an electroplating solution 104 without any suppressor agents and accelerator agents. For the electroplating solution 104 described herein, the VMS includes the at least one acid. As used herein, "suppression strength" of one or more suppressor agents of an electroplating solution 104 is determined by a decrease in current density at a cathode of an electrochemical cell that includes a suppressed solution containing VMS and the one or more suppressor agents compared to current density at a cathode of an electrochemical cell that includes a solution containing generally only the VMS, with each current density measured at about −0.7 volts relative to a mercurous sulfate electrode ("MSE"). For the electroplating solution 104 described herein, a suppressed solution includes the at least one acid and the at least one suppressor agent. As merely an example, when a current density at a cathode of an electrochemical cell utilizing a suppressed solution is five times lower than a current density of an electrochemical cell utilizing a VMS, a suppressor agent provides a suppression strength of 5.0.

As used herein, "acceleration strength" of one or more accelerator agents of an electroplating solution 104 is measured by an increase in current density at a cathode of an electrochemical cell that includes an accelerated solution containing VMS and the one or more accelerator agents compared to current density at a cathode of an electrochemical cell that includes the above-described suppressed solution, with each current density measured at about −0.7 volts relative to a MSE. For the electroplating solution 104 described herein, an accelerated solution includes the at least one acid and the at least one accelerator agent. As merely an example, when a current density at a cathode of an electrochemical cell utilizing an accelerated solution is two times higher than a current density of an electrochemical cell utilizing a suppressed solution, an accelerator agent provides an acceleration strength of 2.0.

The at least one suppressor agent of the electroplating solution 104 is formulated to substantially suppress formation of dendrites during electroplating copper from the electroplating solution 104 and improve other qualities of an electroplated copper film, such as surface roughness, ductility, brightness, and electrical conductivity. The at least one suppressor agent may be present in the electroplating aqueous solution in concentration from about 10 mg/L to about 1000 mg/L. In some embodiments, the at least suppressor agent is present in the electroplating solution 104 in an amount sufficient to provide a suppression strength of at least about 5.0. The at least one suppressor agent may be a surfactant, a leveler agent, a wetting agent, a chelating agent, or an additive that exhibits a combination of any of the foregoing functionalities. The at least one suppressor agent may be selected from one or more of the following suppressor agents: a quaternized polyamine, a polyacrylamide, a cross-linked polyamide, a phenazine azo-dye (e.g., Janus Green B), an alkoxylated amine surfactant, a polyether surfactant, a non-ionic surfactant, a cationic surfactant; an anionic surfactant, a block copolymer surfactant, polyacrylic acid, a polyamine, aminocarboxylic acid, hydrocarboxylic acid, citric acid, entprol, edetic acid, tartaric acid, and any other suitable suppressor agent.

When present, the at least one accelerator agent of the electroplating solution 104 is formulated to increase the deposition rate of copper onto the surface 112 of the substrate 110 and present in the electroplating solution 104 in an amount sufficient to provide an acceleration strength of at least about 2.0. The at least one accelerator agent may further increase the brightness of the electroplated copper film 120 and other qualities, such as decreasing void concentration in the electroplated copper film 120. The at least one accelerator agent may be present in the electroplating solution 104 in concentration from about 10 mg/L to about 1000 mg/L. According to various embodiments, the at least one accelerator agent may be selected from an organic sulfide compound, such as bis(sodium-sulfopropyl)disulfide, 3-mercapto-1-propanesulfonic acid sodium salt, N,N-dimethyl-dithiocarbamyl propylsulfonic acid sodium salt, 3-S-isothiuronium propyl sulfonate, or mixtures of any of the preceding chemicals. Additional suitable accelerator agents include, but are not limited to, thiourea, allylthiourea, acetylthiourea, pyridine, mixtures of any of the preceding chemicals, or another suitable accelerator agent. The at least one accelerator may also comprise an inorganic compound selected to increase the deposition rate of the copper from the electroplating solution 104, decrease hydrogen evolution that can increase the porosity in the electroplated copper film 120, or both. For example, suitable inorganic compounds may comprise selenium-containing anions (e.g., $SeO_3^{2-}$ and $Se^{2-}$), tellurium-containing anions (e.g., $TeO_3^{2-}$ and $Te^{2-}$), or both.

Additionally, many of the disclosed accelerator agents may be substantially-free of alkali elements (e.g., sodium and potassium), which can be detrimental to the performance of semiconductor devices used in ICs. Accordingly, a copper film deposited from one of the disclosed electroplating solutions having an accelerator agent that is substantially free of alkali elements will also be substantially-free of alkali elements.

For example, in an embodiment of the invention, a substantially sodium-free accelerator agent of 3,3'-Dithio-1,1'-propanedisulfonic acid may be synthesized. As shown in reaction (1) below, thiourea or N-substituted derivatives of thiourea having at least one hydrogen atom attached to one or both of the nitrogen atoms may be reacted with the 1,3-propane sultone to form S-thiuronium alkane sulfonate, which is a derivative of thiourea containing a sulfonic acid group.

As shown below in reaction (2) below, S-thiuronium alkane sulfonate may be reacted with an aqueous solution of ammonia to produce guanidinium 3-mercapto-alkanesulfonate.

(3)

As shown in reaction (3) below, the quanidinium 3-mercapto-alkanesulfonate so-formed may be passed through a cationic ion exchange resin so that quanidinium ions are replaced by hydrogen ions to form 3-mercapto-1-propanesulfonic acid.

Then, the 3-mercapto-1-propanesulfonic acid so-formed may be dissolved in water in an amount, for example, to form a 10 percent by mass solution. Diethylamine (e.g., about 0.25 g/mol) may be added to the solution. The mixture may be heated to reflux and while being mixed (e.g., by stirring) a small about (e.g., 0.05 g/mol) of powdered sulfur may be added to the mixture. Then, the mixture may be refluxed for a sufficient time (e.g., 8 to 10 hours) until the reaction is completed. The water may be evaporated in vacuum. The chemical reaction is shown in reaction (4) and the bis(diethylammonium) 3,3'-dithio-1,1'-dipropanedisulfonate so-formed is typically a brown viscous syrup.

The bis(diethylammonium) 3,3'-dithio-1,1'-dipropanedisulfonate is dissolved in water to obtain, for example, a 10 percent by mass solution. As shown in reaction (5) below, this solution may be passed through an ion exchange resin of, for example, Amberlite IR-120 ion exchange resin operating in its acid cycle or another suitable ion exchange resin. After washing the ion exchange resin with water until the pH of the effluate is about 5 to about 6, the aqueous effluates may be combined and evaporated in vacuum until substantially all the water is removed from the reaction product, which is 3,3'-Dithio-1,1'-propanedisulfonic acid in the form of a light-brown viscous syrup.

In another embodiment of the invention, an accelerator agent of substantially sodium-free 3,3'-Dithio-1,1'-propanedisulfonic acid may be synthesized directly via an ion exchange process. For example, bis(sodium-sulfopropyl)disulfide may be passed through a suitable ion exchange medium to remove substantially all of the sodium and form substantially sodium-free 3,3'-Dithio-1,1'-propanedisulfonic acid according to reaction (6) below.

Referring again to FIG. 1, in other embodiments of the invention, the anode 106 may be configured as an inert anode, such as a platinum anode (e.g., a porous platinum anode) having a selected surface area relative to the surface 112 of the substrate 110 being electroplated so that in combination with the chemistry of the electroplating solution 104 the ratio of the cathode current density at the surface 112 to the anode current density at the anode 106 is at least about 20. In such an embodiment, the electroplating solution 104 includes copper in the form of cupric ions ($Cu^{2+}$) dissolved therein from another copper source besides the anode 104. The copper may be present in the electroplating solution 104 in a concentration of at least about 50 g/L and, more particularly, from about 50 g/L to about 100 g/L. In a more specific embodiment of the invention, the concentration of the copper may be at least about 75 g/L to about 100 g/L, and more particularly about 75 g/L. The copper may be provided from a copper source, such as one or more of the following copper sources: copper sulfate, copper polyphosphate, copper sulfamate, copper alkane sulfonate, copper chloride, copper acetate, copper formate, copper fluoride, copper nitrate, copper oxide, copper tetrafluoroborate, copper trifluoromethanesulfonate, copper trifluoroacetate, copper hydroxide, and any other suitable copper source.

Figure 5A:
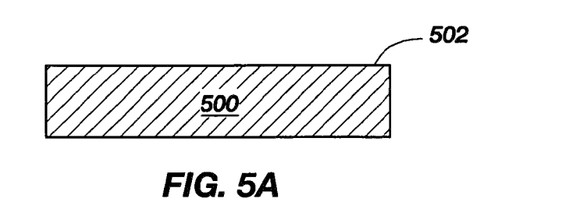
FIGS. 5A-5E are cross-sectional views illustrating various stages in a method of electroplating bumps according to an embodiment of the invention.
Figure 5B:
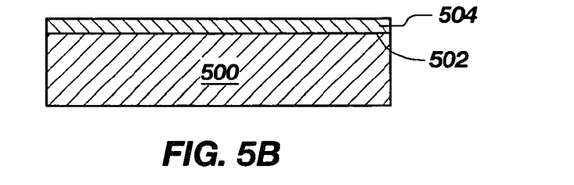

One application of the above-described embodiments of electroplating methods is for electroplating copper to form bumps (also known as pillars) on a semiconductor substrate. FIGS. 5A-5E are cross-sectional views illustrating various stages in a method of electroplating bumps according to an embodiment of the invention. Referring to FIG. 5A, in one embodiment of the invention, a semiconductor substrate 500 (e.g., a single crystal silicon substrate) having a surface 502 is provided. Referring to FIG. 5B, a seed layer 504 may be deposited onto the surface 502 of the substrate 500 using, for example, CVD, PVD, or another suitable deposition technique. For example, the seed layer 504 may comprise tungsten, copper, or another suitable seed layer that promotes the deposition of copper. Although not shown, an adhesion layer made from titanium, tungsten, alloys thereof, or another suitable material may be deposited onto the surface 502, and the seed layer 504 may be deposited onto the adhesion layer to improve adhesion of the seed layer 504.

Figure 5C:
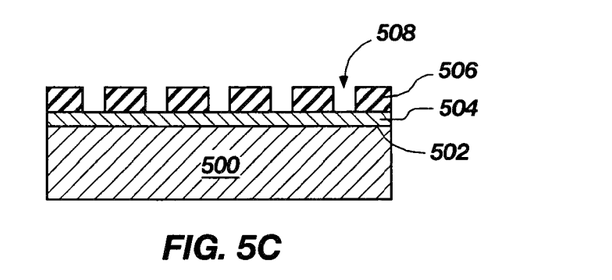
Figure 5D:
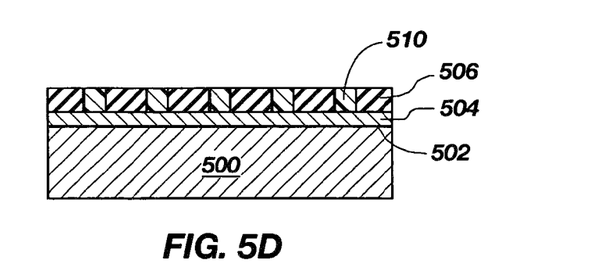

Referring to FIG. 5C, a photoresist may be applied to the seed layer 504 and photolithographically patterned to form a mask layer 506 having a plurality of openings 508 therein. Referring to FIG. 5D, copper may be electroplated into the plurality of openings 508 and on the exposed portions of the seed layer 506 to form a plurality of bumps 510. The copper may be electroplated into the plurality of openings 508 and onto surfaces 509 exposed through the mask layer 506 using any of the previously described embodiments of methods described herein. The surface area of the anode 106 and surface area of respective surfaces 509 are selected in combination with the chemistry of the electroplating solution 104 so that the copper is plated under conditions in which a ratio of a cathode current density at the respective surfaces 509 to an anode current density at the anode 106 is at least about 20.

The geometry of the bumps 510 may be selectively controlled by the concentration of the accelerator agent and the at least one acid (e.g., sulfuric acid) in the electroplating solution 104. In an embodiment, the electroplating solution 104 may include an accelerator agent concentration between about 10 to about 120 parts per million ("ppm"). The bumps 510 exhibit hemispherical-type geometry (i.e., convexly curved) at high accelerator agent concentrations, a dimpled geometry at low accelerator agent concentrations, and a substantially planar upper surface (shown in FIGS. 5D and 5E) at accelerator agent concentrations in between 10 ppm and 120 ppm. For example, for a given accelerator agent concentration, a sulfuric acid concentration of 60 g/L in the electroplating solution 104 may result in generally flat bumps 510, while a sulfuric acid concentration of about 30 g/L may result in dimpled bumps 510.

Figure 5E:
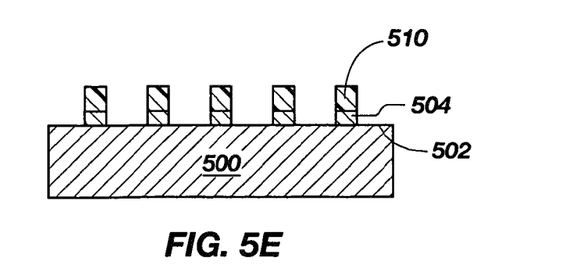

Referring to FIG. 5E, the mask layer 506 may be stripped using a suitable solvent and exposed portions of the seed layer 504 may be removed by etching.

Embodiments of Methods for Conditioning a Consumable Copper Anode

Referring to again FIG. 1, in another embodiment of the invention, the anode 106 may be a consumable copper-containing anode having a surface area of about two times or more than that of the surface 112 of the substrate 110 being electroplated. For example, the anode 106 may be configured as a generally flat plate comprised of copper and having a surface area of about two times or more than that of the surface 112 of the substrate 110 being electroplated. Unlike the above-described embodiments, in this embodiment, the copper film 120 is not electroplated onto the surface 112 under conditions in which a ratio of a cathode current density at the surface to an anode current density at the anode is at least about 20. In this embodiment, the anode 106 is treated to form a porous anodic film (not shown) that promotes the formation of a more uniform electrical double layer adjacent to it during the electroplating of the copper film 120. That is, the porous anodic film of the anode 106 enables utilizing a high current density (e.g., about 400 mA/cm$^2$) at the anode 106 while still maintaining a relatively uniform electrical double layer in the electroplating solution 104 adjacent it despite the anode 106 having a generally flat configuration.

The porous anodic film formed on the anode 106 may comprise copper oxide, copper chloride, copper phosphide, or combinations of the foregoing depending upon the chemistry of the electroplating solution 104. Because the porous anodic film is porous, copper from the anode 106 may still oxidize during the electroplating process and dissolve into the electroplating solution 104, and plate onto the surface 112 of the substrate 110.

In practice, the porous anodic film may be formed on the copper anode 106 by passing a charge of about 1000 coulombs per liter of electroplating solution 104 ("C/L") or more through the electroplating solution 104 of the electrochemical cell 115 using a conditioning cathode instead of using the surface 112 of the substrate 110 as the cathode as depicted in FIG. 1. For example, the conditioning cathode may be formed from a material that is relatively chemically inert in the electroplating solution 104. A charge of about 1000 C/L or more may be generated by applying a selected voltage waveform, using the power source 114, between the surface 112 to be electroplated and the anode 106 so that a current is passed through the electrochemical cell 115 for a time sufficient to pass 1000 C/L through the electroplating solution 104 and form the porous anodic film.

After forming the porous anodic film on the anode 106, the conditioning cathode may be removed and replaced with the surface 112 of the substrate 110 to be electroplated. That is, the surface 112 of the substrate 110 functions as the cathode. Then, a copper film 120 may be electroplated onto the surface 112, as previously described, by applying a selected voltage between the surface 112 and the anode 106 having the porous anodic film formed thereon as a result of the conditioning process. For example, any of the previously described compositions for the electroplating solution 104 may be used. Furthermore, the substrate 110 may be moved (e.g., rotated, linearly oscillated, or both) during electroplating.

In an embodiment of the invention, the conditioning process for forming the porous anodic film on the anode 106 may be performed in a separate conditioning electrochemical cell including the anode 106, electroplating solution 104, and the conditioning cathode. Then, the conditioned anode 106 having the porous anodic film formed thereon may be removed from the conditioning electrochemical cell used in a separate electroplating electrochemical cell, such as the electrochemical cell 115 shown in FIG. 1, for electroplating the copper film 120.

Utilizing the disclosed electroplating methods in which the anode 106 has been conditioned, the copper film 120 may be electroplated onto the surface 112 of the substrate 110 at a high-deposition rate, such as about 6 µm per minute or more and, more particularly, about 9 µm per minute. Additionally, the electroplated copper film 120 may be substantially free of dendrites and exhibit a high-degree of (111) crystallographic texture that is more resistant to stress-induced voiding than other crystallographic textures.

The disclosed methods may be used for electroplating a high-quality copper film at a high-deposition rate to form many different types of electrically conductive structures other than copper bumps or pillars. For example, copper electroplated according to methods disclosed herein may be used to form interconnects for ICs using a Damascene process. Copper electroplated according to methods disclosed herein may also be used to form through-substrate interconnects or other metallization structures in ICs and other electronic devices. Moreover, copper electroplated according to methods disclosed herein may also be used to form electrical contacts for solar cells. The foregoing, non-limiting, list of applications merely provides some examples of uses of copper electroplated according to the embodiments of methods disclosed herein.

WORKING EXAMPLES

The following working examples set forth methods for electroplating copper bumps and a method for synthesizing an accelerator agent composed of 3,3'-Dithio-1,1'-propanedisulfonic acid that is substantially free of alkali elements. Examples 1 and 2 are working examples of methods for electroplating copper bumps at a cathode current density to anode current density ratio of greater than 20. Example 3 is a working example of a method for electroplating copper bumps using a flat copper anode that has been conditioned. Example 4 is a working example of a method for forming an accelerator agent of 3,3'-Dithio-1,1'-propanedisulfonic acid that is substantially free of alkali elements. The following working examples provide further detail in connection with the specific embodiments described above.

Example 1

A 20 nm thick titanium adhesion layer was deposited onto a surface of a single-crystal silicon wafer, followed by depositing a 100 nm thick copper seed layer onto the adhesion layer. The titanium adhesion layer and copper seed layer were each deposited using PVD. A photoresist was applied to the seed layer and photolithographically patterned to form a mask layer having a plurality of openings therein that exposed portions of the seed layer. An electrochemical cell was formed by immersing the silicon wafer including the mask layer in an electroplating solution with an anode. The anode of the electrochemical cell was made from a grooved copper anode. The electroplating solution had a composition of 60 g/L of copper, 60 g/L of sulfuric acid, and 50 mg/L hydrochloric acid. The electroplating solution further included the following additives: 2 mL/L of eMAT™ accelerator/brightener RB10, 20 mL/L of eMAT™ suppressor RS14, and 5 mL/L of eMAT™ leveler RL6.

Copper was electroplated into the plurality of openings of the mask layer and onto the exposed, respective surfaces of the seed layer by applying a voltage between the anode and the silicon wafer to impress a cathodic direct current density of about 300 mA/cm$^2$ to form a plurality of bumps. The ratio of the current density at the cathode to the current density at the anode was about 40. The copper was deposited at a rate of about 6 μm per minute. Examination of the electroplated copper bumps using a scanning electron microscope showed that the copper bumps were generally dendrite free, had relatively planar upper surfaces, and exhibited a surface roughness of less than 20 nm. X-ray diffraction also showed that the copper bumps had a strong (111) crystallographic texture.

Example 2

A 20 nm thick Ti adhesion layer was deposited onto a surface of a single-crystal silicon wafer, followed by depositing a 100 nm thick copper seed layer onto the adhesion layer. The titanium adhesion layer and copper seed layer were each deposited using PVD. A photoresist was applied to the seed layer and photolithographically patterned to form a mask layer having a plurality of openings therein that exposed portions of the seed layer. An electrochemical cell was formed by immersing the silicon wafer including the mask layer in an electroplating solution with an anode. The anode of the electrochemical cell was made from a grooved copper anode. The electroplating solution had a composition of 60 g/L of copper, 60 g/L of sulfuric acid, and 50 mg/L of hydrochloric acid. The electroplating solution further included the following additives: 2 mL/L of eMAT™ accelerator/brightener RB10, 20 mL/L of eMAT™ suppressor RS14, and 5 mL/L of eMAT™ leveler RL6.

Copper was electroplated into the plurality of openings of the mask layer and onto the exposed, respective surfaces of the seed layer by applying a voltage between the anode and the silicon wafer to impress a cathodic direct current density of about 700 mA/cm$^2$ to form a plurality of bumps. The ratio of the current density at the cathode to the current density at the anode was about 60. The copper was deposited at a rate of about 11 μm per minute. Examination of the electroplated copper bumps using a scanning electron microscope showed that the copper bumps were generally dendrite free, had relatively planar upper surfaces, and exhibited a surface roughness of less than 20 nm. X-ray diffraction also showed that the copper bumps had a strong (111) crystallographic texture.

Example 3

A 20 nm thick titanium-tungsten alloy adhesion layer was deposited onto a surface of a single-crystal silicon wafer, followed by depositing a 100 nm thick copper seed layer onto the adhesion layer. The titanium-tungsten alloy adhesion layer and copper seed layer were each deposited using PVD. A photoresist was applied to the seed layer and photolithographically patterned to form a mask layer having a plurality of openings therein that exposed portions of the seed layer. An electrochemical cell was formed by immersing the silicon wafer including the mask layer in an electroplating solution with an anode. The anode of the electrochemical cell was made from a piece of flat copper. The electroplating solution had a composition of 60 g/L of copper, 60 g/L of sulfuric acid, and 50 mg/L of hydrochloric acid. The electroplating solution further included the following additives: 2 mL/L of eMAT™ accelerator/brightener RB10, 20 mL/L of eMAT™ suppressor RS14, and 5 mL/L of eMAT™ leveler RL6. The copper anode was conditioned in the electroplating solution by passing a charge of about 5000 C/L through the electroplating solution by impressing a direct current density of 400 mA/cm$^2$ at the copper anode.

Copper was electroplated into the plurality of openings of the mask layer and onto the exposed, respective surfaces of the seed layer by applying a voltage between the anode and the silicon wafer to impress a cathodic direct current density of about 200 mA/cm$^2$ to form a plurality of bumps. The ratio of the current density at the cathode to the current density at the anode was about 4. The copper was deposited at a rate of 7 μm per minute. Examination of the electroplated copper bumps using a scanning electron microscope showed that the copper bumps were generally dendrite free, had relatively planar upper surfaces, and exhibited a surface roughness of less than 20 nm. X-ray diffraction also showed that the copper bumps had a strong (111) crystallographic texture.

Example 4

Thiourea was reacted with the 1,3-propane sultone to form S-thiuronium alkane sulfonate. The S-thiuronium alkane sulfonate so-formed was reacted with an aqueous solution of ammonia to produce guanidinium 3-mercapto-alkanesulfonate. The quanidinium 3-mercapto-alkanesulfonate so-formed was passed through a cationic ion exchange resin so that quanidinium ions were replaced by hydrogen ions to form 3-mercapto-1-propanesulfonic acid. Then, the 3-mercapto-1-propanesulfonic acid so-formed was dissolved in water in an amount to form a 10 percent by mass solution. Diethylamine in an amount of about 0.25 g/mol was added to the solution. The mixture was heated to reflux and, while being mixed by stirring, about 0.05 g/mol of powdered sulfur was added to the mixture. Then, the mixture was refluxed for about 8 to 10 hours until the reaction was completed and bis(diethylammonium) 3,3'-dithio-1,1'-dipropanedisulfonate was formed. The water was evaporated in vacuum. The bis (diethylammonium) 3,3'-dithio-1,1'-dipropanedisulfonate so-formed was a brown viscous syrup.

The bis(diethylammonium) 3,3'-dithio-1,1'-dipropanedisulfonate was dissolved in water to obtain a 10 percent by mass solution. This solution was passed through an ion exchange resin of Amberlite IR-120 ion exchange resin operating in its acid cycle. After washing the ion exchange resin with water until the pH of the effluate was about 5 to about 6, the aqueous effluates were combined and evaporated in vacuum until all the water was removed from the reaction product and 3,3'-Dithio-1,1'-propanedisulfonic acid was obtained having a light-brown viscous syrup.

From the foregoing it will be appreciated that, although specific embodiments of the invention have been described herein for purposes of illustration, various modifications may be made without deviating from the spirit and scope of the invention.

The invention claimed is:

1. A method of electroplating copper, comprising:
forming an electrochemical cell including at least one surface of a substrate exhibiting a plurality of openings, an anode, and an electroplating solution in contact with the at least one surface and the anode, wherein the electroplating solution includes at least one suppressor agent;
selecting a ratio of a cathode current density at the at least one surface to an anode current density at the anode to be in a range of about 40 to about 100; and
selecting a strength and a concentration of the at least one suppressor agent and a surface area of the anode such that the ratio is in said range
during electroplating of copper onto the at least one surface and into the plurality of openings, the electroplated copper in the plurality of openings being substantially-free of dendrites.

2. The method of claim 1 wherein the ratio is about 60 to about 100.

3. The method of claim 1 wherein: the anode comprises an inert anode; and electroplating copper onto the at least one surface comprises electroplating the copper from dissolved copper in the electroplating solution.

4. The method of claim 1 wherein: the anode comprises a copper-containing anode; and electroplating copper onto the at least one surface comprises electroplating the copper provided from the copper-containing anode.

5. The method of claim 1 wherein the anode comprises a copper-containing anode.

6. The method of claim 5 wherein the copper-containing anode comprises: a porous mass of copper particles; a grooved body comprising copper; a porous mass of sintered copper-containing particles; or a mesh comprising copper.

7. The method of claim 1 wherein electroplating copper comprises applying a time-varying voltage between the anode and the at least one surface of the substrate.

8. The method of claim 1 wherein forming an electrochemical cell including at least one surface of a substrate, an anode, and an electroplating solution in contact with the at least one surface and the anode comprises forming the electrochemical cell to include the at least one surface, the anode, and the electroplating solution having dissolved copper therein present in a concentration from about 50 grams per liter to about 100 grams per liter.

9. The method of claim 1 wherein the at least one suppressor agent of the electroplating solution comprises one or more of the following suppressor agents: a surfactant; a chelating agent; a leveler agent; and a wetting agent.

10. The method of claim 1 wherein the electroplating solution comprises at least one accelerator agent.

11. The method of claim 10 wherein the at least one accelerator agent is substantially free of at least one type of alkali element.

12. The method of claim 1, further comprising linearly oscillating the substrate in the electroplating solution during the act of electroplating copper.

13. The method of claim 1, further comprising rotating the substrate in the electroplating solution during the act of electroplating copper.

14. The method of claim 1 wherein electroplating copper comprises depositing the copper into the plurality of openings as a substantially dendrite-free film at a deposition rate of at least about 6 μm per minute.

15. The method of claim 1 wherein the at least one suppressor agent provides a suppression strength of at least about 5.0.

16. The method of claim 1 wherein forming an electrochemical cell including at least one surface of a substrate, an anode, and an electroplating solution in contact with the at least one surface and the anode comprises immersing the substrate in the electroplating solution.

17. The method of claim 1 wherein the electroplated copper exhibits a high-degree of (111) crystallographic texture.

* * * * *